United States Patent [19]

Tsai

[11] Patent Number: 5,387,871
[45] Date of Patent: Feb. 7, 1995

[54] METHOD OF TESTING CHARACTERISTICS OF BATTERY SET

[76] Inventor: Wei-Jen Tsai, No. 26, Ming-Der Lane, Ming-Der Street, Ta-Li Hsiang, Taichung Hsien, Taiwan, Prov. of China

[21] Appl. No.: 981,496

[22] Filed: Nov. 25, 1992

[51] Int. Cl.⁶ ............................................. G01N 27/416
[52] U.S. Cl. ................................. 324/429; 324/434; 320/14; 320/48
[58] Field of Search .............. 324/429, 430, 433, 434; 340/636; 320/48, 14

[56] References Cited

U.S. PATENT DOCUMENTS

| | | | |
|---|---|---|---|
| 3,515,983 | 6/1970 | Lante | 324/434 |
| 3,786,343 | 1/1974 | Ehlers | 324/434 |
| 3,857,087 | 12/1974 | Jones | 320/48 |
| 3,872,457 | 3/1975 | Ray et al. | 320/48 |
| 4,697,134 | 9/1987 | Burkum et al. | 324/430 |
| 4,871,956 | 10/1989 | Barrella | 320/48 |
| 4,876,513 | 10/1989 | Brilmyer et al. | 320/48 |
| 5,099,211 | 3/1994 | Nowak | 324/434 |
| 5,206,578 | 4/1993 | Nor | 320/48 |
| 5,214,385 | 5/1993 | Gabriel et al. | 320/48 |
| 5,218,288 | 6/1993 | Mickal et al. | 320/48 |
| 5,239,286 | 8/1993 | Komatsuda | 320/48 |
| 5,302,902 | 4/1994 | Groehl | 324/434 |

OTHER PUBLICATIONS

Electronics and Instrumentation Aug. 12, 1963, Prensky, see p. 34.

*Primary Examiner*—Maura K. Regan
*Attorney, Agent, or Firm*—Browdy and Neimark

[57] ABSTRACT

A method of testing characteristics of battery set includes a multicircuit voltage tester having a plurality of voltage testing line sets, which are coupled respectively with a positive terminal and a negative terminal of a battery unit of the battery set, which is subsequently permitted to discharge to a load for a predetermined period of time and which is subsequently recharged. During such times when the discharging and the recharging of the battery set are under way, the multicircuit voltage tester is capable of scanning, reading and writing repeatedly the voltage data of each battery unit. Such data are stored in a memory and are plotted equidistantly to form a chart comparing the voltage characteristics of the battery set. The characteristics of each battery unit can be determined by observing the change in space between the characteristic curves in the chart.

5 Claims, 4 Drawing Sheets

METHOD OF TESTING CHARACTERISTICS OF BATTERY SET

BACKGROUND OF THE INVENTION

The present invention relates to a method of testing characteristics of a battery, and more particularly to a comparative method of testing individually the characteristics of a plurality of batteries making up a battery set.

An uninterrupted supply of direct current is an absolute necessity for keeping a normal operation of a computer system or a communication system. However, an incident of power interruption can take place at any moment, due to a simple power stoppage or a malfunction of a rectifier. In order to safeguard the normal operation of the computer system or the communication system, a standby battery set is generally provided to be put into service on an emergency basis. Such standby battery set is always kept ready to serve by being connected with a floating charge of the rectifying system.

Before the battery set is ready to be put into service, it has to be initially charged and then recharged only after it has been discharged successfully on a trial basis. However, the capacitance of the battery set can be eventually eroded after a certain period of time. Such erosion of capacitance may be caused by an incident such as a detachment of active substances, or a hardening of polarized plates; nevertheless the erosion of the battery capacitance can happen to only one of batteries making up the entire battery set which works in tandem. If such incident as described above takes place, the defective battery, which has an inadequate capacitance and an excessive internal resistance, may be responsible for a reversal of electrical charge at such time when the battery set is in the midst of discharging, thereby bringing about an overload of the battery set. It is therefore necessary to detect the defective battery of the entire battery set, so as to ensure that the normal operation of the computer system or the communication system is not unduly jeopardized by the defect of the standby battery set at such time when an interruption of city power service takes place.

According to the prior art method of testing the capacitance of batteries of the standby battery set, it is necessary that the computer system or the communication system is first disconnected with the standby battery set, which is then caused to carry a false load, such as a resistance, for a discharging test. The electrical current and the time of the discharging test of the battery set are dependent on the capacitance of the batteries in terms of ampere-hour. As a result, it often takes several hours of discharging and more than ten hours of charging before one can figure out the capacitance of the battery set in one testing of the battery set, assuming that the capacitance of the battery set is 3200 ampere hours and that discharging current is selected at 400 amperes, with the discharging time being eight hours. In addition, it is required in the course of carrying out such testing that there is always some one who is present at the testing site to record the voltage of each of batteries of the set, and the specific gravity and the temperature of the electrolyte. In other words, such prior art method of testing the battery set results in a senseless waste of the man power. For example, a local area communication system is generally backed up by a standby battery set which is composed of at least 24 batteries. It is conceivable that the task of checking and testing the characteristics of each of the twenty four batteries is extremely cumbersome and costly.

SUMMARY OF THE INVENTION

It is, therefore, the primary objective of the present invention to provide a method of testing characteristics of battery set, in which a multicircuit voltage tester is used. The multicircuit voltage tester is provided with a plurality of voltage testing line sets, which are coupled respectively with the positive and the negative terminal posts of each of batteries making up the standby battery set and which are also in communication with a current senser for taking the measurement of the amount of the current that passes through the battery. Subsequently, a rectifier of the battery set in question is cut off so as to permit the battery system to discharge for a period lasting several minutes before the rectifier is turned on to allow the battery set to be recharged. During the period when the discharging and the recharging take place, the data such as voltage and current of each battery are entered and recorded in a computer via the multicircuit voltage tester. The computer is programmed to calculate, on the basis of the information on the terminal voltage of each battery of the standby battery set, the internal resistance characteristics of each battery at such times when the discharging and the recharging of each battery take place. The internal resistance characteristics are then plotted comparatively for an easy identification of a battery, which is defective and is individually tested for its capacitance ratio in order to determine the state of the characteristics of the poorest battery.

The foregoing objective, method, function and feature of the present invention will be better understood by studying the following detailed description of a preferred embodiment of the present invention, in conjunction with the drawings provided herewith.

DETAILED DESCRIPTION OF THE PREFERRED EMBODIMENT

Figure 1:
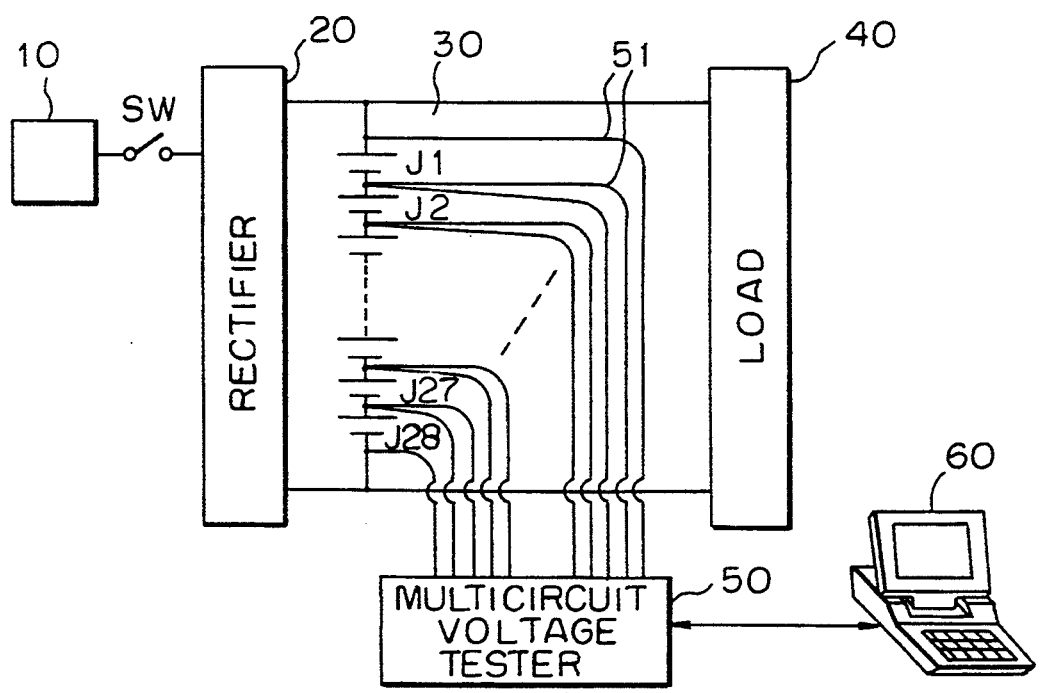
FIG. 1 shows a system scheme of a method of testing the characteristics of a battery set, according to the present invention.

Referring to FIG. 1, a power supply circuit of a communication gear or an uninterrupted power system is shown to comprise an alternating current source 10 in communication with a rectifier 20 via a switch designated as SW. The rectifier 20 converts the alternating current into the direct current, which is arranged in a parallel manner in a battery set 30 and is then connected with a load 40 which is in fact a communication gear or an uninterrupted power system. As soon as the alternating current source 10 is interrupted, or as soon as the switch SW is turned off, the rectifier 20 is shut off immediately. As a result, the battery set 30 supplies the direct current to keep the load 40 in a normal operating condition. It is therefore important that each of the battery units making up the battery set 30 must remain in good working condition, so as to ensure that the battery set 30 is capable of supplying an adequate amount of power to the load 40 in case of an interruption of city power service.

According to the present invention, a multicircuit voltage tester 50 is provided with twenty eight sets of voltage testing lines, which are designated as J1 ... J28 and are connected respectively with the positive and the negative terminals of each of battery units making up the batter set 30, with a view to testing the terminal voltage of each battery unit of the battery set 30. As soon as the switch SW is turned off, the rectifier 20 is shut off at once, thereby resulting in the discharge of the stored energy of the battery set 30 to the load 40, which is therefore kept in a normal operating condition. Such discharging process is permitted to last for a period of about ten minutes before the disabled rectifier 20 is reactivated. In other words, the switch SW is turned on to recharge the battery set 30. The entire testing process lasts about 30 minutes. During the period between the discharging of the battery set 30 and the recharging of the battery set 30, the voltage value and the current value of each battery of the battery set 30 are automatically entered and recorded in a computer 60 via the multicircuit voltage tester 50 and a RS232C tandem communication. The computer 60 is programmed to calculate, on the basis of the recorded terminal voltage of each battery, the internal resistance characteristics of each battery at the times when the discharging and the recharging of the battery set took place. The data so computed by the computer 60 are plotted on a chart, which shows comparatively the curves representing the voltage characteristics of the battery units making up the battery set 30. It is extremely easy for a technician to identify a defective battery in the battery set 30 by comparing and studying the curves in the chart. The defective battery so identified is then tested for its capacitance ratio by means of a battery testing device, such as a single battery capacitance tester, so as to obtain the information on the state of the battery voltage characteristics. The technician may depend on such information to decide if the defective battery is to be repaired or to be replaced.

Figure 2A:
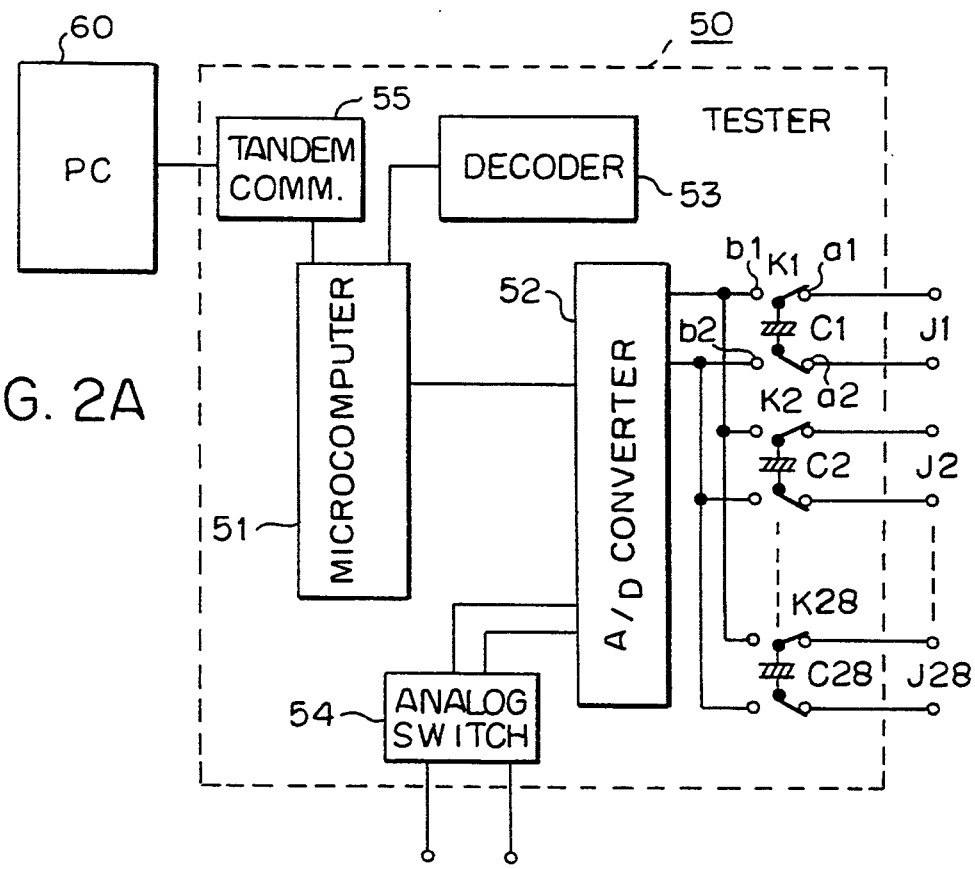
FIGS. 2A and 2B show a circuitry of a multicircuit voltage tester, according to the present invention, with relays in inactive and active positions respectively.
Figure 2B:
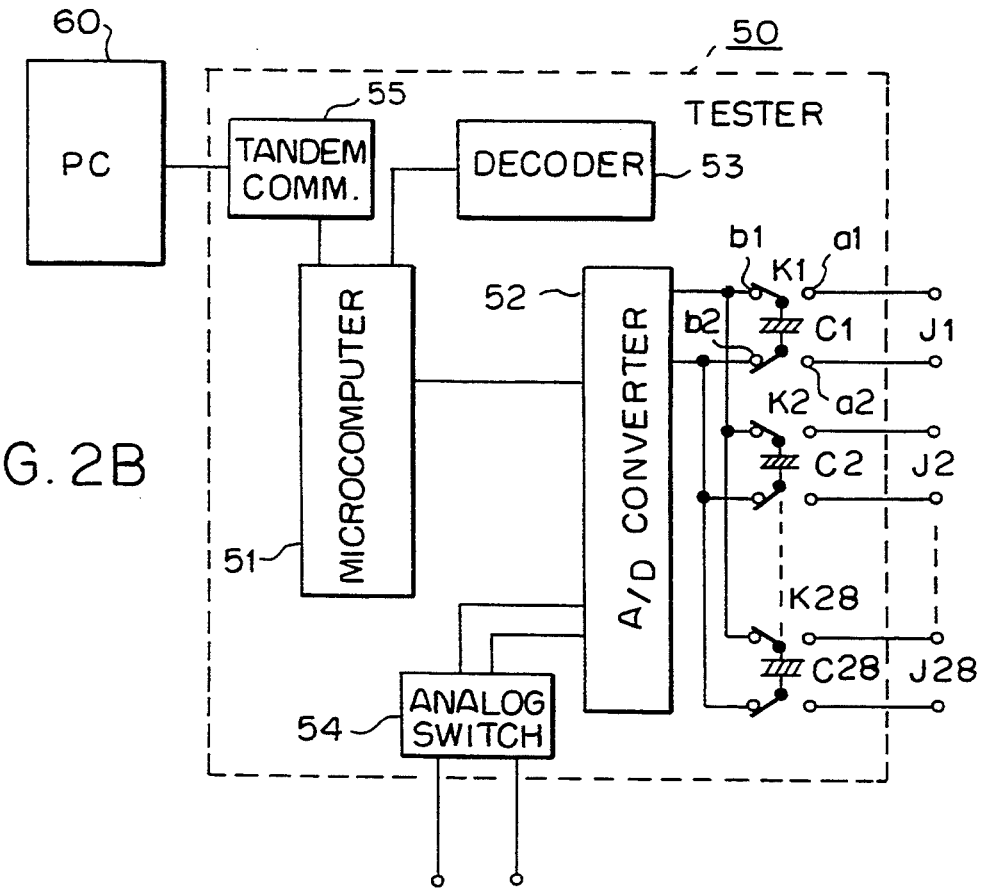

Now referring to FIGS. 2A and 2B, the multicircuit voltage tester 50 of the present invention is shown comprising a microcomputer 51, an analog-to-digital converter 52, a decoder 53, twenty eight relays (k1 ... K28), twenty eight sets of voltage testing lines (J1 ... J28), an analog switch 54, and a RS232 tandem communication 55. The multicircuit voltage tester 50 is used for testing and recording the terminal voltages of the battery set composed of a series of batteries. According to a preferred embodiment of the present invention, the tester 50 comprises twenty seven sets of voltage testing circuits of 0–4 v, one set of voltage testing circuit of 0–75 v, and a current testing circuit associated with the analog switch 54. The microcomputer 51 is in charge of transmitting, via a RS232 tandem communication 55, all the data so obtained to a personal computer 60 in which the data are processed.

The microcomputer 51 is equipped with a 12-bit analog-to-digital converter 52 as an information read-write interface. The multicircuit voltage tester 50 is characterized in that the terminal voltages V1-V28 of the battery set 30 are stored in the capacitors C1-C28 at such time when the relays K1-K28 remain inactive, as shown in FIG. 2A, and that the microcomputer 51 is able to read, via the analog-to-digital converter, the voltage stored in the capacitor at such time when one of the relays is activated by the microcomputer 51 through the decoder 53. Therefore, the voltage values of all capacitors C1-C28 can be read and stored one after another by the microcomputer 51 by means of all relays K1-K28, which are activated, shown in their active state in FIG. 2B, one by one by the microcomputer 51 via the decoder 53. In addition, the inactive state of each relay resumes as soon as the relay in question has been activated, so as to ensure that each capacitor remains in a state of being charged as soon as the voltage stored in the capacitor in question has been read by the microcomputer 51. The multicircuit voltage tester 50 is capable of finishing the task of scanning and reading the terminal voltages of the entire battery set 30 within seconds. As a result, the fluctuations of the terminal voltages of each battery of the battery set 30 can be intensively collected and stored within the time span of 30 minutes, during which the charging and the discharging of the battery set 30 take place. The extent of internal resistance of each battery of the battery set 30 can be deduced on the basis of the information on the values of the terminal voltages of the battery set 30, which are measured at the times when the charging and the discharging of the battery set 30 take place. Their interrelationship can be theoretically expounded hereinafter.

The relationship between a terminal voltage and an internal resistance of a battery at the time when the discharging of the battery takes place can be expressed by the following equation, in which TV stands for terminal voltage; CPB, chemical potential of battery; DC, discharging current; IR, internal resistance of battery.

$$TV = CPB - DC \times IR$$

Similarly, the relationship between a terminal voltage and an internal resistance of a battery at the time when the charging of the battery takes place can be expressed by the following equation, in which TV stands for terminal voltage; CPB, chemical potential of battery; CC, charging current; IR, internal resistance of battery.

$$TV = CPB + CC \times IR$$

The present invention is based on the above theories. Accordingly, when the battery set 30 is in the midst of discharging, a battery of the set 30 having a greater internal resistance must have a relatively lower terminal voltage. On the other hand, when the charging of the battery set 30 is in progress, a battery of the battery set 30 having a greater internal resistance must have a relatively higher terminal voltage. If a battery set remains in good working condition, all battery units making up the battery set should have internal resistances similar to one another. Therefore, the curves plotted to represent the voltage characteristics of battery units of the battery set should be similar to one another. At the time when a discharging process of a defective battery is under way, the battery has voltage characteristics which are represented by a curve plotted at a lower level. On the other hand, when a charging process of a defective battery is under way, the battery has voltage characteristics which are represented by a curve plotted at a higher level. Such voltage data of all battery units of the battery set 30 are processed by the personal computer 60, which plots a characteristic curve for each battery unit of the battery set 30. If the entire battery set 30 remains in good wording condition, the curves so plotted should be spaced equidistantly. It is therefore easy for a technician to identify a defective battery by studying the chart.

Figure 3:
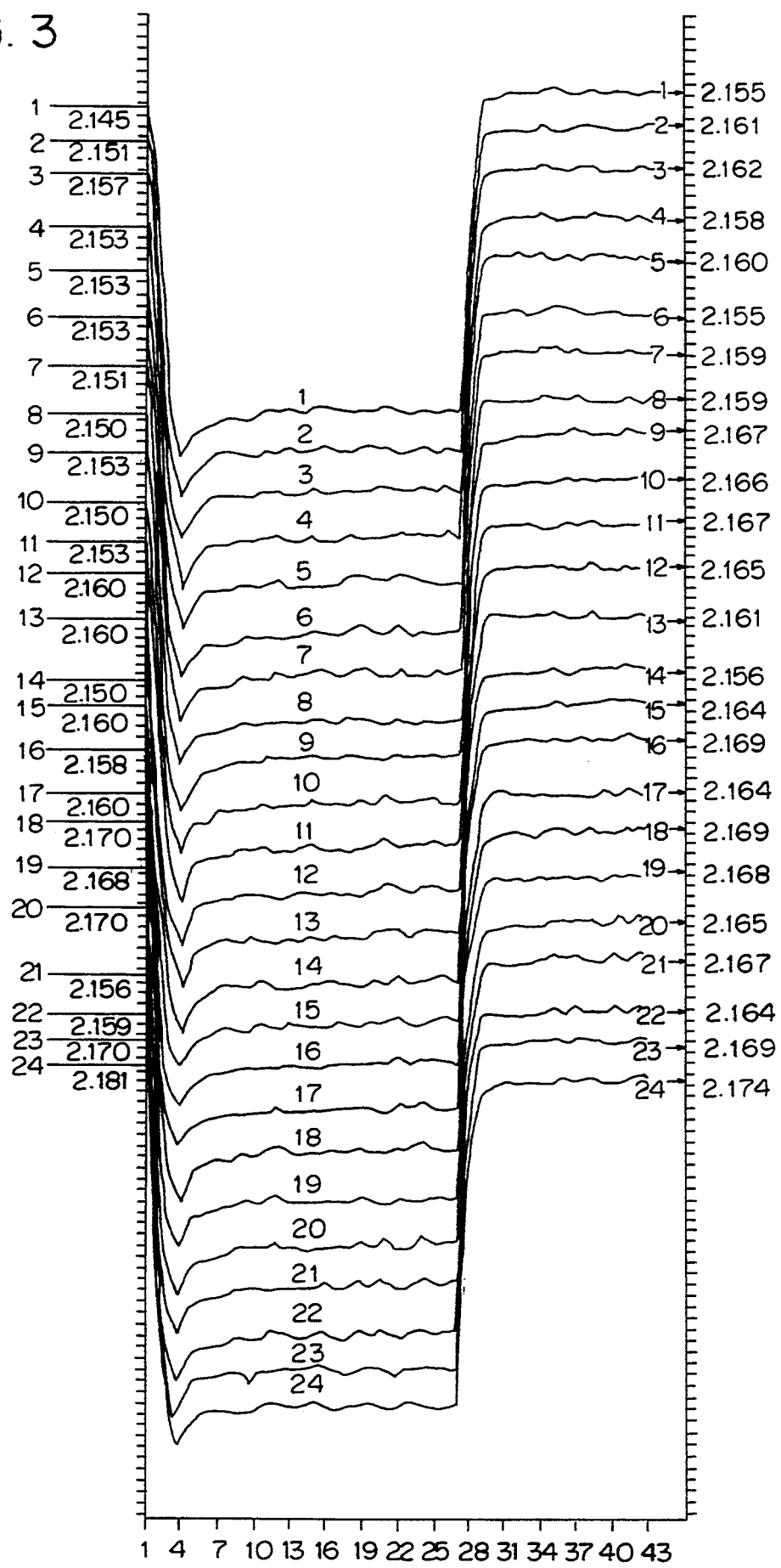
FIG. 3 is a comparative chart showing the curves representing the voltage characteristics of a battery set in good working condition, according to the present invention.

As shown in FIG. 3, the voltage characteristic curves of all battery units of a standby battery set in good working condition are plotted. The voltages are lower at the time when the discharging process takes place during the first 27 minutes, after which the voltages rise as the charging process takes over. However, all the curves are spaced in coordinate equidistantly in view of the fact that the internal resistances of all battery units of the battery set are more or less consistent. It is therefore concluded that all battery units making up the battery set are in good working condition.

Figure 4:
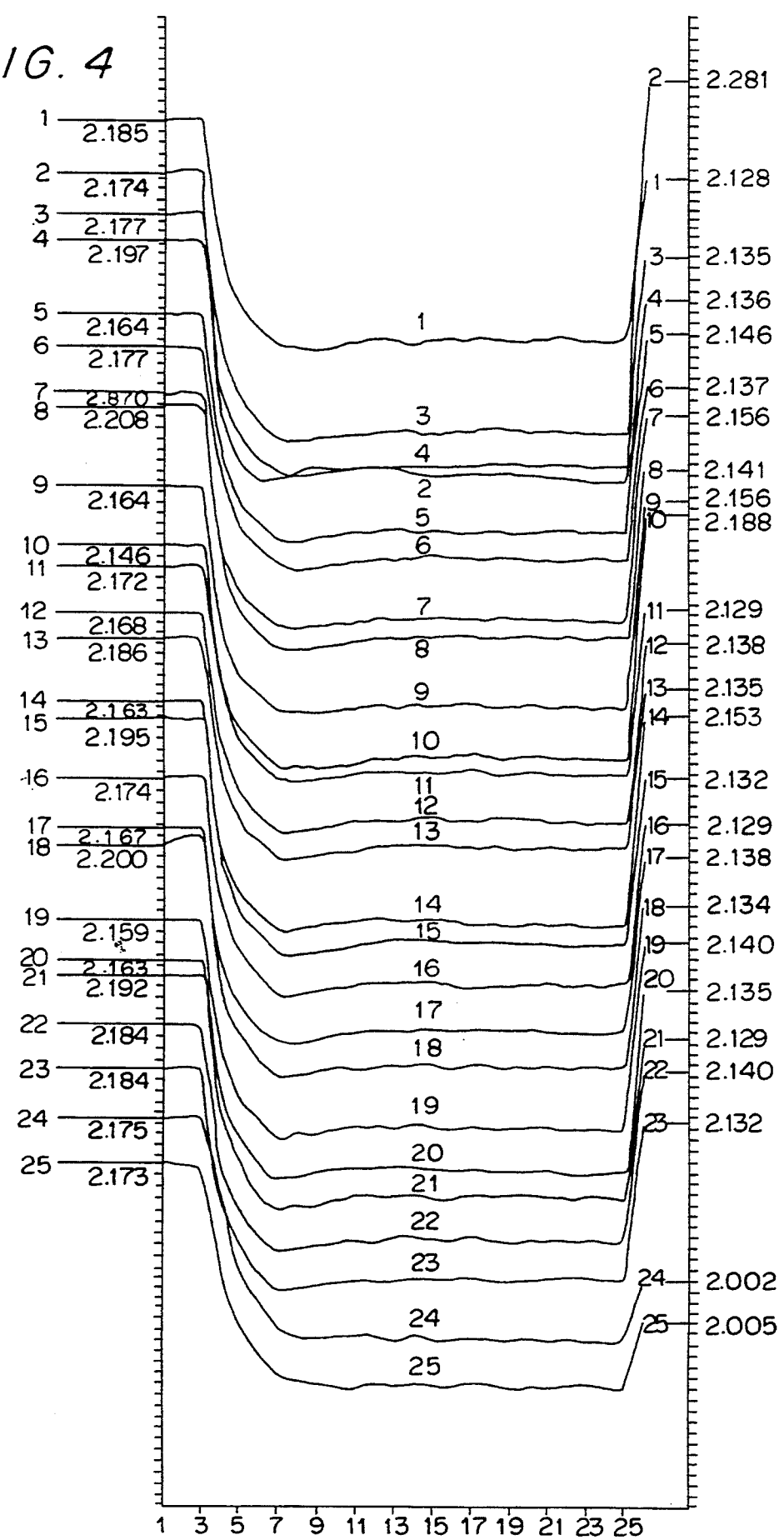
FIG. 4 is a comparative chart showing the curves representing the voltage characteristics of a battery set having defective component batteries, according to the present invention.

The voltage characteristic curves of all battery units of a standby battery set in poor working condition are plotted comparatively, as shown in FIG. 4. The curve representing the voltage characteristic of a defective battery at the time of discharging is plotted at a relatively low level, while the curve representing the voltage characteristic of the defective battery at the time of charging is plotted at a relatively high level. By observing the plotted curves of voltage characteristics at the time of discharging, one can see clearly that the battery units 2, 10 and 14 are seriously defective, especially the unit 2. These three defective battery units are thus easily identified and should be subsequently tested. The rest of the battery units are obviously in good working condition.

According to the present invention, an alternative method of detecting a defective battery unit of the battery set is suggested. Such alternative method includes a computer computation of the average voltage value of the battery set and a comparison of the voltage value of a battery unit with the average voltage value of the battery set. Therefore, the deviation percentage of the voltage value of each battery unit of the battery set can be determined. As a result, a list of battery units arranged in sequence on the basis of their deviation percentages can be obtained. If the voltage value of a battery unit shows a sharp divergence from the average voltage value of the battery set, the battery unit is suspected to be a defective one, which should be further tested.

In addition to a multicircuit voltage tester that is used to test each battery set, the present invention is also designed in such a way that each battery set is provided with a set of multicircuit voltage tester for measuring and scanning the voltage in accordance with a prescribed pattern. The data so obtained are stored or transmitted to a monitoring center, where the characteristics of the battery system are determined. Even the battery having sound characteristics and having poor bar contact can be also detected.

In comparing the method of the present invention with the prior art method, it is appropriate to point out the fact that the prior art method has the following shortcomings:
 (a) According to the prior art method, it takes three to eight hours to complete a discharging test, during which a large amount of heat energy is generated by a high voltage current of the battery set under testing. As a result, a large amount of energy is wasted.
 (b) The prior art method of testing the battery set lasts continuously 20 to 24 hours and requires someone to be present at the test site to do the chores of keeping the test records.
 (c) Each battery set of the system of uninterrupted power service of a communication gear or a large UPS is composed of something like 24 to 100 or more units of battery. It would take a tremendous amount of time for technicians to check and record the data such as voltage, temperature, and specific gravity of all battery units of a battery set. In addition, the accuracy of such prior art method of testing is further undermined by taking a few samples of battery units for testing. The fluctuations of the terminal voltages of the battery units during the testing period can also complicate the reliability and the precision of the method.
 (d) It is often difficult to analyze the characteristics of each battery unit of the battery set.

Therefore, the advantages of the present invention over the prior art have become apparent and are further expounded explicitly hereinafter.

The battery set is composed of a series of battery units. As a result, an increase in the internal resistance of a given battery unit of the battery set will be a factor responsible for a decrease in the charging current of the battery set which is being charged, thereby resulting in a reduction in the stored energy of the battery set. Therefore, such battery set discharges less amount of current and can even bring about a reverse discharge. Therefore, the present invention makes use of a computer to do the work of compiling and analyzing the characteristics of each battery unit of the battery set. Such computer-aided method makes it easy for a technician to identify a defective battery unit of the battery set. According to the present invention, the internal resistance of the battery refers to the electrolytic resistance and the resistance induced by a poor connection of the battery terminals. Therefore, the information of the characteristics of each battery unit of the battery set, which is made available by the method of the present invention, can be useful for the maintenance work of the battery set.

The embodiment of the present invention described above is to be regarded in all respects as merely illustrative and not restrictive. Accordingly, the present invention may be embodied in other specific forms without deviating from the spirit thereof. The present invention is therefore to be limited only by the scope of the hereinafter appended claims.

What is claimed is:

1. A method of testing characteristics of battery set making use of a multicircuit voltage tester having a plurality of voltage testing line sets connected respectively with a positive terminal and a negative terminal of a battery unit of said battery set, which is subsequently permitted to discharge to a load for a period of time upon an interruption of an input power source and which is subsequently recharged by a resumption of said input power source; wherein said multicircuit voltage tester scanns, reads and writes repeatedly data of voltage of said battery unit of said battery set at a time when said battery set discharges and is recharged, with said data stored in a memory of said multicircuit voltage tester and plotted as characteristic curves in relation to time such that said characteristic curves are spaced in coordinate equidistantly to form a chart, comparing said characteristic curves and determining a characteristic of said battery unit of said battery set by observing a change in space between said characteristic curves.

2. The method of claim 1 wherein said multicircuit voltage tester comprises a microcomputer in communication with an analog-to-digital converter and a decoder; wherein said multicircuit voltage tester is characterized in that said analog-to-digital converter has an input terminal communicating with a plurality of relays, each of which is connected with a capacitor and provided with a set of voltage testing lines coupled respectively with a positive terminal and a negative terminal of a battery to be tested, and further that said decoder is controlled by said microcomputer to activate said relays one after another so as to enter a voltage value of said capacitor into said analog-to-digital converter, which converts said voltage value into a digital datum to be stored in said microcomputer.

3. The method of claim 1 wherein said battery unit of said battery set is connected in parallel with a capacitor, through which a terminal voltage of said battery unit is measured.

4. The method of claim 1 wherein said battery set has an average voltage value which is computed by all voltage values of all battery units making up said battery set; wherein said battery unit has a voltage value deviation percentage which is obtained by comparing said voltage value of said battery unit with said average voltage value of said battery unit; and wherein the characteristic of said battery unit is poor if said deviation percentage of said battery unit shows a sharp divergence from said average voltage value of said battery set.

5. A method of testing characteristics of a battery set making use of a multicircuit voltage tester having a plurality of capacitors, each of which is connected no a voltage testing line set connected respectively with a positive terminal and a negative terminal of a battery unit of said battery set, which battery set is subsequently permitted to discharge to a load for a period of time upon an interruption of an input power source and which battery set is subsequently recharged by a resumption of said input power source, comprising the steps of scanning, reading and writing repeatedly data on the voltage of each battery unit of said battery set at a time when said battery set discharges and is recharged by scanning, reading and writing the voltages across each of the capacitors;

storing said data in a memory of said multicircuit voltage tester;

plotting said stored data as characteristic curves in relation to time with said characteristic curves spaced in coordinates equidistantly from each other on a chart;

observing for a variance in equidistant spacing between said characteristic curves;

and determining from said chart which battery units in said battery set require individual testing by determining where variance from equidistant spacing exists.

* * * * *